(12) United States Patent
Figuet et al.

(10) Patent No.: US 8,309,437 B2
(45) Date of Patent: Nov. 13, 2012

(54) (110) ORIENTED SILICON SUBSTRATE AND A BONDED PAIR OF SUBSTRATES COMPRISING SAID (110) ORIENTED SILICON SUBSTRATE

(75) Inventors: Christophe Figuet, Crolles (FR); Oleg Kononchuk, Grenoble (FR)

(73) Assignee: Soitec, Bernin (FR)

( * ) Notice: Subject to any disclaimer, the term of this patent is extended or adjusted under 35 U.S.C. 154(b) by 632 days.

(21) Appl. No.: 12/450,295

(22) PCT Filed: Feb. 26, 2008

(86) PCT No.: PCT/IB2008/000573
§ 371 (c)(1), (2), (4) Date: Sep. 18, 2009

(87) PCT Pub. No.: WO2008/114108
PCT Pub. Date: Sep. 25, 2008

(65) Prior Publication Data
US 2010/0038756 A1    Feb. 18, 2010

(30) Foreign Application Priority Data
Mar. 20, 2007   (EP) .................................... 07290338

(51) Int. Cl.
*H01L 21/20* (2006.01)
(52) U.S. Cl. ........................ 438/478; 438/481
(58) Field of Classification Search .......... 438/478, 438/479, 481, 607
See application file for complete search history.

(56) References Cited

U.S. PATENT DOCUMENTS

| | | | |
|---|---|---|---|
| 4,349,394 A * | 9/1982 | Wei | 438/476 |
| 6,197,669 B1 * | 3/2001 | Twu et al. | 438/585 |
| 6,821,825 B2 * | 11/2004 | Todd et al. | 438/150 |
| 7,479,187 B2 * | 1/2009 | Otsuka | 117/89 |
| 2005/0250302 A1 | 11/2005 | Todd et al. | |
| 2006/0068568 A1 | 3/2006 | Yanase | |

OTHER PUBLICATIONS

International Search Report for PCT/IB2008/000573, mailed Jul. 18, 2008, 3 pages.
Hartman, J.M. et al., "Growth kinetics of Si and SiGe on Si(100), Si(110) and Si(111) surfaces," Journal of Crystal Growth, vol. 294, Issue 2, Sep. 4, 2006, pp. 288-295.
Pak, James J. et al., "A Micromachining Technique for a Thin Silicon Membrane Using Merged Epitaxial Lateral Overgrowth of Silicon and SiO2 for an Etch-Stop," International Conference on Solid-State Sensors and Actuators, Transducers '91, Jun. 24, 1991, pp. 1028-1031.
Sullivan, Jim et al., "Layer-Transfer Process Modifications for Fabricating Hybrid Crystal Orientation Engineered Substrates," 2005 IEEE International SOI Conference, Oct. 3, 2005, pp. 121-122.

* cited by examiner

*Primary Examiner* — Kevin M Picardat
(74) *Attorney, Agent, or Firm* — TraskBritt

(57) ABSTRACT

The present invention relates to method of fabricating a (110) oriented silicon substrate and to a method of fabricating a bonded pair of substrates comprising such a (110) oriented silicon substrate. The invention further relates to a silicon substrate with (110) orientation and to a bonded pair of silicon substrates comprising a first silicon substrate with (100) orientation and a second silicon substrate with (110) orientation. Methods include the steps of providing a basic silicon substrate with (110) orientation, the basic silicon substrate having a roughness being equal or less than 0.15 nm RMS, and depositing epitaxially a silicon layer with (110) orientation on the basic silicon substrate at a pressure between 40 Torr to 120 Torr, and at a temperature between about 1000° C. and about 1200° C. and using trichlorosilane or dichlorosilane as silicon precursor gas.

10 Claims, 3 Drawing Sheets

(110) ORIENTED SILICON SUBSTRATE AND A BONDED PAIR OF SUBSTRATES COMPRISING SAID (110) ORIENTED SILICON SUBSTRATE

CROSS-REFERENCE TO RELATED APPLICATION

This application is a U.S. National Phase Entry under 35 U.S.C. §371 of International Application No. PCT/IB2008/000573, filed Feb. 26, 2008, published in English as PCT International Publication No. WO 2008/114108 on Sep. 25, 2008, which claims priority to European Patent Application No. 07290338.8, filed Mar. 20, 2007. The entire contents of these applications and their associated specifications are incorporated herein by this cross-reference.

TECHNICAL FIELD

The present invention relates to a method of fabricating a (110) oriented silicon substrate and to a method of fabricating a bonded pair of substrates comprising such a (110) oriented silicon substrate. The invention further relates to a silicon substrate with (110) orientation and to a bonded pair of silicon substrates comprising a first silicon substrate with (100) orientation and a second silicon substrate with (110) orientation.

BACKGROUND

Since it is known that hole mobility is more than doubled on (110) silicon substrates compared with conventional (100) substrates, there is an increasing interest in manufacturing of high quality silicon substrates with (110) orientation. However, electron mobility is the highest on (100) substrates. Based on this knowledge, a new technology to fabricate high performance CMOS devices has been developed using hybrid silicon substrates with different crystal orientations, wherein pFETs are formed on a (110) oriented surface and nFETs are formed on a (100) surface and the different substrates are bonded.

For the manufacturing of such hybrid substrates with high quality, in particular the surface quality of the bonded substrates plays an important role. It is known from SOI substrates that the surface quality of the thin silicon layer on top of SOI substrates can suffer from some defects like HF-defects due to the presence of crystal defects being already present in the original CZ silicon material such as Crystal Oriented Pits (COP) and oxygen precipitations.

Therefore, some wafer manufacturers have developed special processes to fabricate (100) oriented silicon substrates with very low densities of COPs resulting in the effect that almost no defects such as HF-defects on final hybrid substrates were observed. It was further tried to form similarly bulk (110) silicon substrates without such defects, but these technologies are very expensive and show a very low yield due to low crystal growth. Beyond this, (110) oriented silicon is known to become easily rough and have problems in surface reconstruction because heat treatment of (110) substrates reveals low energy planes.

DISCLOSURE OF THE INVENTION

It is therefore the object of the present invention to provide a (110) oriented silicon substrate as well as a method of fabricating such a (110) oriented silicon substrate and to provide a bonded pair of substrates comprising a (110) oriented silicon substrate, as well as a method of fabricating such a bonded pair of substrates with a high efficiency wherein the formed (110) substrate has at least near and at its surface virtually no defects.

The object is solved by a method of fabricating a silicon substrate with (110) orientation, comprising the steps of providing a basic silicon substrate with (110) orientation, the basic silicon substrate having a roughness being equal or less than 0.15 nm RMS in a 2×2 $\mu m^2$ scan or a 10×10 $\mu m^2$ scan, and depositing epitaxially a silicon layer with (110) orientation on the basic silicon substrate at a pressure between about 40 Torr and about 120 Torr, preferably 80 Torr, and at a temperature between about 1000° C. and about 1200° C. and using trichlorosilane or dichlorosilane as silicon precursor gas.

Surprisingly, the low pressure during the deposition of the epitaxial silicon layer leads, in comparison to normally applied processes under atmospheric pressure, to a decrease of the number of surface defects. Thus, the inventive method can be applied on bulk (110) basic silicon wafers having initially an increased number of surface defects; wherein after the formation of the (110) silicon layer on top of the substrate, the surface quality is much better than before. In doing so, the surface quality of the substrate can be enhanced without the necessity to provide an initial (110) substrate with a high crystal quality with time and cost intensive crystal growth processes.

On the contrary, the inventive method leads in a relatively fast and low cost way to the effect that the produced (110) substrates have at least at and near the surface virtually no defects. The epitaxial (110) silicon layer covers effectively all defects, in particular, the COPs of the underlying (110) basic silicon substrate without degrading the surface roughness of the resulting (110) silicon substrate.

Although it is known from the prior art, that the formation of epitaxial (110) silicon layers at temperatures between 1000° C. and 1200° C. leads to substrates with high haze, it is possible with the present invention by means of the application of the low pressure to result in substrates with a very low haze.

According to a favorable embodiment of the present invention, a heat treatment at a temperature between about 1000° C. and about 1200° C. is applied in an $H_2$ containing environment on the basic silicon substrate before depositing the silicon layer. This bake treatment before the deposition of the epitaxial (110) silicon layer helps to form good conditions for silicon deposition on the surface of the basic silicon substrate. In other variants of the present invention, the temperature can be modified before the epitaxial growth.

A particularly suitable example of the invention includes pressure during the deposition of the silicon layer from about 40 Torr to about 120 Torr, preferably 80 Torr. Processes performed at this pressure showed especially well surface characteristics of the produced substrates. For instance, it could be shown that the number of defects on an initial basic (110) silicon wafer of more than 1000 COPs on the surface could be decreased to a number of less than ten defects with a size of equal or more than 0.13 μm.

It is furthermore advantageous if the silicon layer is deposited up to a thickness of at least 1 μm. This thickness is especially effective if all defects with a size of more than 0.13 μm on the surface of the produced (110) substrate shall be removed.

In a beneficial embodiment of the invention, the silicon layer is deposited with a growth rate of about 0.25 μm/min. to about 1.0 μm/min. at a temperature up to 1100° C. with dichlorosilane (DCS) as precursor or with a growth rate of about 3.0 μm/min. using trichlorosilane (TCS) as precursor at a temperature up to 1200° C. Astonishingly, despite of the relatively high growth rate that normally leads to higher roughness due to the phenomenon of "step bunching," the formed (110) silicon substrate has a very low surface roughness, which is comparable with the original roughness of the basic (110) silicon substrate before layer deposition and can be, for instance, about 0.1 nm RMS in a 2×2 µm² scan, as well as in a 10×10 µm² scan.

In an appropriate example of the invention, the silicon layer is deposited in such a way that it contains no defects with a size of more than 0.13 µm, as measured by light scattering tools.

The object is moreover solved by a method of fabricating a bonded pair of silicon substrates comprising a first silicon substrate with (100) orientation and a second silicon substrate with (110) orientation, the method comprising the steps of providing the first silicon substrate, providing a basic silicon substrate with (110) orientation, the basic silicon substrate having a roughness being equal or less than 0.15 nm RMS in a 2×2 µm² scan or a 10×10 µm² scan, depositing epitaxially a silicon layer with (110) orientation on the basic silicon substrate at a pressure between about 40 Torr and about 120 Torr, preferably 80 Torr, and at a temperature between about 1000° C. and about 1200° C. and using trichlorosilane or dichlorosilane as silicon precursor gas to form the second silicon substrate, and bonding the first silicon substrate with the second silicon substrate.

With this inventive method, a bonded pair of silicon substrates with different orientations can be provided wherein, in particular, the (110) silicon substrate has very good surface characteristics which are especially suited to form at this surface microelectronic devices with high performance.

The above-mentioned method of fabricating the bonded pair of substrates can be modified in accordance with the particular embodiments of the present invention for fabricating the (110) silicon substrate as explained above.

Moreover, the object of the invention is solved by a silicon substrate with (110) orientation, comprising a basic silicon substrate with (110) orientation, the basic silicon substrate having a roughness being equal or less than 0.15 nm RMS in a 2×2 µm² scan or a 10×10 µm² scan, and an epitaxial silicon layer with (110) orientation grown on the basic silicon substrate.

It is especially advantageous if the epitaxial silicon layer contains no defects with a size of more than 0.13 µm as measured by light scattering tools.

Furthermore, the object of the invention is solved by a bonded pair of silicon substrates comprising a first silicon substrate with (100) orientation and a second silicon substrate with (110) orientation, wherein the second silicon substrate comprises a basic silicon substrate with (110) orientation, the basic silicon substrate having a roughness being equal or less than 0.15 nm RMS in a 2×2 µm² scan or a 10×10 µm² scan, and an epitaxial silicon layer with (110) orientation grown on the basic silicon substrate.

In a beneficial variant of the invention, the epitaxial silicon layer contains no defects with a size of more than 0.13 µm, as measured by light scattering tools.

DESCRIPTION OF THE DRAWINGS

In the following, favorable embodiments of the invention and their advantages are exemplified by means of the figures wherein.

DETAILED DESCRIPTION OF THE INVENTION

Figure 1:
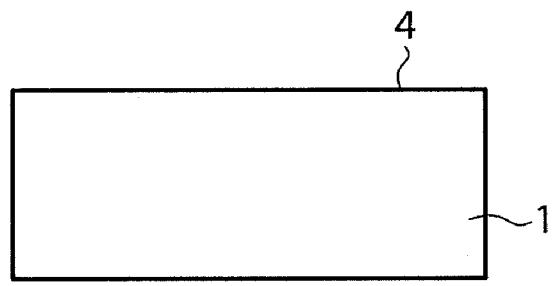
FIG. 1 schematically shows a basic (110) silicon substrate.

FIG. 1 schematically shows a basic silicon CZ bulk substrate 1 with a (110) crystal orientation. The silicon substrate 1 has on its surface 4 a roughness that is equal or less than 0.15 nm RMS in a 2×2 µm² or a 10×10 µm² scan and has a defect number of more than 1000 COPs at its surface 4, as measured by light scattering tools, such as, for example, an SP1 tool developed by KLA-Tencor, Milpitas, Ca.

Figure 2:
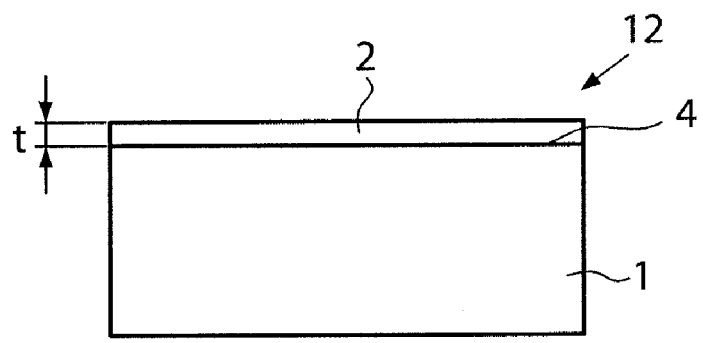
FIG. 2 schematically shows the silicon substrate of FIG. 1 after the deposition of an epitaxial (110) silicon layer.

FIG. 2 schematically shows a (110) silicon substrate 12 consisting of the basic silicon substrate 1 of FIG. 1 and an epitaxial (110) silicon layer 2 formed on the surface 4 of the basic (110) silicon substrate 1.

Figure 3:
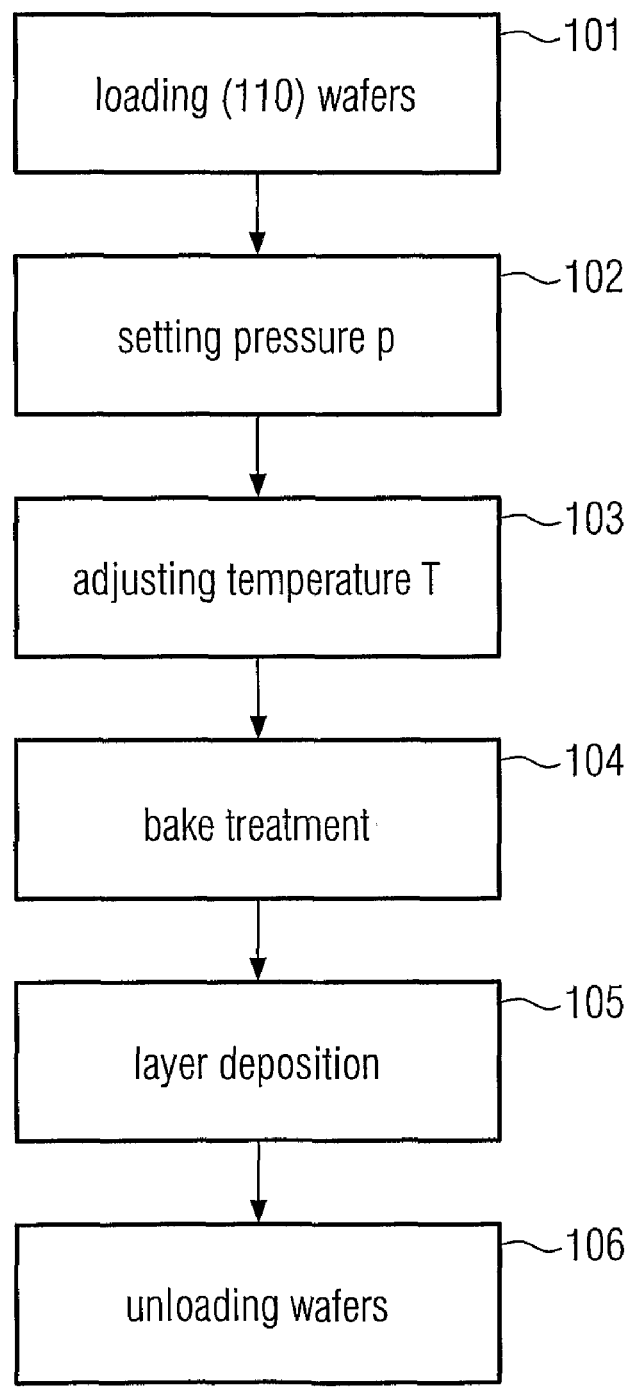
FIG. 3 shows an example of a possible sequence of steps for fabricating a (110) silicon substrate as shown in FIG. 2 according to the method of the present invention.

FIG. 3 shows an example of a possible sequence of steps for fabricating the (110) silicon substrate 12 of FIG. 2 according to the method of the present invention.

With reference to step 101, (110) oriented silicon wafers such as the substrate 1 of FIG. 1 are loaded in a process chamber.

Then, in the process chamber a pressure p of about 20 to about 200 Torr, preferably of about 100 Torr, is set in step 102.

According to step 103, an appropriate temperature T of about 1000° C. to about 1200° C. is adjusted in the process chamber.

Thereafter, in step 104, a bake treatment is applied on the wafers at a temperature T of about 1000° C. to about 1200° C. in an $H_2$-containing environment. The pressure P as well as the temperature T may be modified during the bake treatment.

In the next step 105, the epitaxial (110) silicon layer 2 is formed on the substrate 1 using trichlorosilane (TCS) or dichlorosilane (DCS) as silicon precursor gas at a pressure P between about 20 Torr and about 200 Torr, preferably about 100 Torr and at a temperature T between about 1000° C. and about 1200° C. The process time of the epitaxial deposition is adapted to the flow of the precursor gas in dependence on the desired thickness of the epitaxial layer 2. Preferably, the (110) silicon layer 2 is deposited with a thickness t of at least 1 µm.

The epitaxial layer 2 is preferably grown with a growth rate between 0.25 µm/min. and 1.0 µm/min. using the DCS precursor or even more around 3 µm/min. using the TCS precursor, wherein the more rapid the growth rate is the more step bunching effects occur leading to a higher roughness.

In the particular example shown, the epitaxial layer 2 is deposited at a pressure P of 80 Torr, at a temperature T of 1080° C., with a growth rate of 1.0 µm/min., an $H_2$ flow of 40 slm and a DCS flow of 400 sccm.

Referring to step 106, the pressure of the process chamber as well as the temperature are adjusted to unload the wafers.

The (110) silicon layer 2 shows virtually no defects with a size of more than 0.13 µm. Moreover, the roughness at the surface of the resulting (110) silicon substrate is very low.

Figure 4:
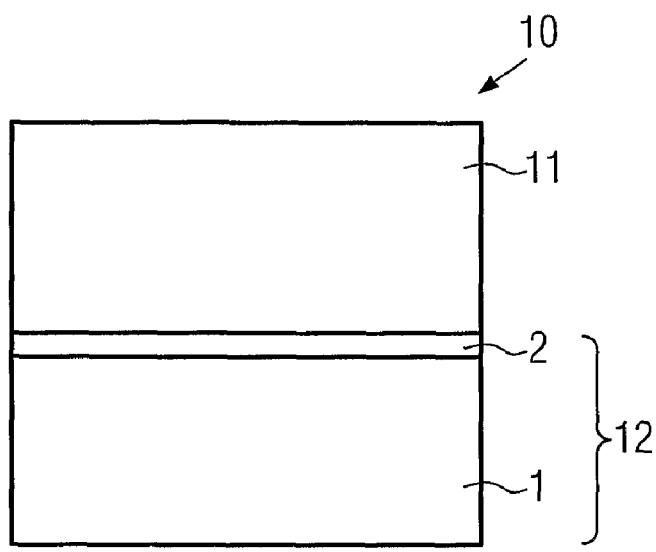
FIG. 4 schematically shows a bonded pair of substrates comprising a (110) oriented silicon substrate and a (100) oriented silicon substrate, produced by a method according to the present invention.

FIG. 4 schematically shows a bonded pair of substrates 10 comprising a first (100) oriented silicon substrate 11 and a second (110) oriented silicon substrate 12, produced by a method according to the present invention. The second (100)

oriented silicon substrate 11 corresponds to the substrate 1 of FIG. 2 produced by a method as described with reference to FIG. 3.

Figure 5:
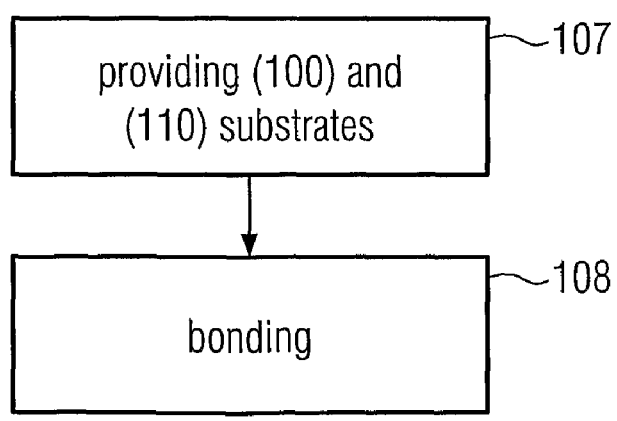
FIG. 5 shows an example of a possible sequence of steps for fabricating a bonded pair of substrates comprising a (100) substrate and a (110) substrate, as shown in FIG. 4, in accordance with the present invention.

FIG. 5 shows an example of a possible sequence of steps for fabricating the bonded pair of substrates 10 of FIG. 4 comprising the first (100) oriented silicon substrate 11 and the second (110) oriented silicon substrate 12, as shown in FIG. 4, in accordance with the present invention. The steps for producing the (110) oriented silicon 12 substrate correspond, in general, to steps of FIG. 3.

As shown in step 107, the (100) oriented silicon substrate 11 and the (110) oriented silicon substrate 12 are provided.

According to step 108, the (100) oriented silicon substrate 11 and the (110) oriented silicon substrate 12 are bonded together to form the bonded wafer pair 10. One of the substrates could be thinned down, by grinding and etching techniques or implantation and splitting, in order to provide a final layer of one of the material on top of the other substrate.

The bonded wafer pair 10 is a hybrid substrate that can be used to integrate therein complementary-metal oxide semiconductor (CMOS) devices. In the (100) oriented silicon substrate 11, n-channel metal oxide semiconductor field effect transistors (nFETs) can be formed because of the high electron mobility of the (100) oriented silicon substrate 11. In particular, in the (110) oriented silicon layer 2 of the (110) oriented silicon substrate 12 p-channel MOSFETs can be formed because of the high hole mobility and the nearly defect free crystallinity of the (110) oriented silicon layer 2.

The invention claimed is:

1. A method of fabricating a silicon substrate with (110) orientation, comprising the steps of:
    providing a basic silicon substrate with (110) orientation, the basic silicon substrate having a roughness being equal or less than 0.15 nm RMS in a 2×2 $\mu m^2$ scan or a 10×10 $\mu m^2$ scan; and
    depositing epitaxially a silicon layer with (110) orientation on the basic silicon substrate and at a temperature between 1000° C. and 1200° C. and using trichlorosilane or dichlorosilane as silicon precursor gas, wherein the pressure during the deposition of the silicon layer is from 40 Torr to 120 Torr.

2. The method of claim 1, wherein a temperature between about 1000° C. and about 1200° C. is applied in an $H_2$-containing environment on the basic silicon substrate before depositing the silicon layer.

3. The method of claim 1, wherein the silicon layer is deposited up to a thickness of at least 1 $\mu m$.

4. The method of claim 1, wherein the silicon layer is deposited with a growth rate of 0.25 $\mu m$/min. to 1.0 $\mu m$/min. using dichlorosilane as a precursor.

5. The method of claim 1, wherein the silicon layer is deposited with a growth rate of 3 $\mu m$/min. using trichlorosilane as a precursor.

6. The method of claim 1, wherein the silicon layer is deposited in such a way that it contains no defects with a size of more than 0.13 $\mu m$, as measured by light scattering tools.

7. The method according to any one of claims 1 to 6, further comprising the steps of:
    providing a first silicon substrate with (100) orientation; and
    bonding the first silicon substrate with the basic silicon substrate comprising the silicon layer forming a second silicon substrate to fabricate a bonded pair of silicon substrates comprising the first silicon substrate with (100) orientation and the second silicon substrate with (110) orientation.

8. A silicon substrate with (110) orientation, comprising a basic silicon substrate with (110) orientation, the basic silicon substrate having a roughness being equal or less than 0.15 nm RMS in a 2×2 $\mu m^2$ or a 10×10 $\mu m^2$ scan, and an epitaxial silicon layer with (110) orientation grown on the basic silicon substrate according to a the method, comprising:
    providing a basic silicon substrate with (110) orientation, the basic silicon substrate having a roughness being equal or less than 0.15 nm RMS in a 2×2 $\mu m^2$ or a 10×10 $\mu m^2$ scan; and
    depositing epitaxially a silicon layer with (110) orientation on the basic silicon substrate and at a temperature between 1000° C. and 1200° C. and using trichlorosilane or dichlorosilane as silicon precursor gas, wherein the pressure during the deposition of the epitaxial silicon layer is from 40 Torr to 120 Torr.

9. The silicon substrate of claim 8, further comprising a first silicon substrate with (100) orientation and a second silicon substrate with (110) orientation, wherein the second silicon substrate comprises the basic silicon substrate with (110) orientation, and the epitaxial silicon layer with (110) orientation.

10. The silicon substrate of claim 8, wherein the epitaxial silicon layer contains no defects with a size of more than 0.13 $\mu m$, as measured by light scattering tools.

* * * * *